(12) United States Patent
Kajii

(10) Patent No.: US 6,260,259 B1
(45) Date of Patent: Jul. 17, 2001

(54) SOLDER BALL MOUNTING DEVICE

(75) Inventor: Yoshihisa Kajii, Ishikawa (JP)

(73) Assignee: Shibuya Kogyo Co., Ltd., Ishikawa (JP)

( * ) Notice: Subject to any disclaimer, the term of this patent is extended or adjusted under 35 U.S.C. 154(b) by 0 days.

(21) Appl. No.: 09/223,394

(22) Filed: Dec. 30, 1998

(30) Foreign Application Priority Data

Jan. 30, 1998 (JP) ................................. 10-033695

(51) Int. Cl.⁷ ............................. B23P 19/00; B23P 21/00
(52) U.S. Cl. ................................................ 29/714; 29/743
(58) Field of Search ........................ 29/743, 714; 269/21; 294/64.1

(56) References Cited

U.S. PATENT DOCUMENTS

| | | | | |
|---|---|---|---|---|
| 4,361,417 | * | 11/1982 | Suzuki | 417/13 |
| 4,476,626 | * | 10/1984 | Gumbert et al. | 29/743 |
| 4,728,135 | * | 3/1988 | Sugimura et al. | 29/743 |
| 4,887,351 | * | 12/1989 | Porterfield et al. | 29/743 |
| 5,174,021 | * | 12/1992 | L'Esperance, III et al. | 29/743 |
| 5,284,287 | * | 2/1994 | Wilson et al. | 228/180.2 |
| 5,467,525 | * | 11/1995 | Pine et al. | 29/743 |
| 5,615,823 | * | 4/1997 | Noda et al. | 228/103 |
| 5,657,528 | * | 8/1997 | Sakemi et al. | 29/743 |
| 5,695,667 | * | 12/1997 | Eguchi et al. | 29/743 |
| 5,749,614 | * | 5/1998 | Reid et al. | 294/64.1 |
| 5,758,409 | * | 6/1998 | Nakazato | 29/743 |
| 5,867,260 | * | 2/1999 | Sakai | 356/237 |
| 5,941,449 | * | 8/1999 | Le Coz et al. | 29/743 |
| 5,961,169 | * | 10/1999 | Kalenian et al. | 294/64.1 |
| 5,983,490 | * | 11/1999 | Sakemi | 29/743 |
| 6,012,222 | * | 1/2000 | Asai et al. | 29/743 |

\* cited by examiner

*Primary Examiner*—S. Thomas Hughes
*Assistant Examiner*—Marc Jimenez
(74) *Attorney, Agent, or Firm*—Sughrue, Mion, Zinn, Macpeak & Seas, PLLC

(57) ABSTRACT

A solder ball mounting device for mounting solder balls on a workpiece is disclosed. A solder ball supplying section in which the solder balls are stored; a sucking head having a plurality of solder ball sucking holes in a lower surface thereof; sucking means coupled to the sucking head so as to suck the solder balls in the solder ball sucking holes; lift means for vertically moving the sucking head; and pressure adjusting means for adjusting and setting degree of vacuum in the sucking head to a first pressure for sucking the solder balls, and to a second pressure which is lower in the degree of vacuum than the first pressure and is high enough to hold the solder balls sucked, are provided. When the sucking head is positioned at a lower position where the sucking head sucks the solder balls by means of the lift means, the pressure adjusting means adjusts and sets the degree of vacuum in the sucking head to the first pressure, and when the degree of vacuum in the sucking head reaches the first pressure, the lift means moves the sucking head upwardly, and thereafter the pressure adjusting means starts adjusting the degree of vacuum in the sucking head thereby setting to the second pressure.

10 Claims, 2 Drawing Sheets

SOLDER BALL MOUNTING DEVICE

BACKGROUND OF THE INVENTION

1. Field of the Invention

This invention relates to a solder ball mounting device for mounting solder balls on a workpiece such as a substrate, and more particularly to an improvement of control means for controlling a pressure and a head position at the time of suction of solder balls in a BGA (ball grid alley) solder ball mounting device.

2. Description of the Related Art

In mounting a plurality of solder balls on a substrate with a solder ball mounting device, in general the following method is employed: A sucking plate having solder ball sucking holes is disposed under the lower surface of a sucking head, and vacuum pressure is utilized to suck solder balls in the sucking holes, and then the solder balls thus sucked are mounted on the substrate. A means has been developed that, in the ball sucking operation, solder balls in a solder ball supply box are caused to float. In order to employ this solder ball floating method to suck solder balls at high speed thereby to shorten the time required for sucking solder balls, it is necessary to increase the degree of vacuum; that is, the solder ball sucking operation is carried out with a large flow rate of solder balls (hereinafter referred to as "a large ball-sucking flow rate", when applicable).

If, in order to increase the solder ball sucking speed, solder balls are sucked with a large ball-sucking flow rate by a high degree of vacuum, and held, then as shown in FIG. 4 air leaks through the contact section of a solder ball 3 and a sucking plate 30. The air leakage sucks an additional solder ball 31. That is, two solder balls are absorbed ("a double ball phenomenon"). The contact surface of the sucking plate 30 and the solder ball 3 is not completely circular, and the solder balls 3 is not completely spherical, as a result of which a gap is formed therein. Through this gap, a force for sucking another solder ball 31 is formed, so that the double ball phenomenon occurs. If the degree of vacuum of the suction pressure is increased, the force of suction through the gap is increased, so that the frequency of occurrence of the double ball phenomenon is also increased.

SUMMARY OF THE INVENTION

An object of the invention is to provide a solder ball mounting device in which solder ball sucking pressure, and a sucking head position are suitably adjusted to prevent the occurrence of a double-ball phenomenon, thereby to perform a solder ball sucking operation with high efficiency.

In order to solve the above-described problems, there is provided a solder ball mounting device for mounting solder balls on a workpiece according to a first aspect of the invention, comprising: a solder ball supplying section in which the solder balls are stored; a sucking head having a plurality of solder ball sucking holes in a lower surface thereof; sucking means coupled to the sucking head so as to suck the solder balls in the solder ball sucking holes; lift means for vertically moving the sucking head; and pressure adjusting means for adjusting and setting degree of vacuum in the sucking head to a first pressure for sucking the solder balls, and to a second pressure which is lower in the degree of vacuum than the first pressure and is high enough to hold the solder balls sucked, wherein, when the sucking head is positioned at a lower position where the sucking head sucks the solder balls by means of the lift means, the pressure adjusting means adjusts and sets the degree of vacuum in the sucking head to the first pressure, and when the degree of vacuum in the sucking head reaches the first pressure, the lift means moves the sucking head upwardly, and thereafter the pressure adjusting means starts adjusting the degree of vacuum in the sucking head thereby setting to the second pressure.

Further, according to a second aspect of the invention, there is provided a solder ball mounting device for mounting solder balls on a workpiece, comprising: a solder ball supplying section in which solder balls are stored; a sucking head having a plurality of solder ball sucking holes in a lower surface thereof; sucking means coupled to the sucking head so as to suck the solder balls in the solder ball sucking holes; wherein, when the solder balls are to be sucked in the sucking holes, the sucking head are moved up and down plural times to suck solder balls, and the solder balls thus sucked are mounted on the workpiece; and pressure setting means for adjusting and setting degree of vacuum in the sucking head to (i) a first pressure with which the solder balls are sucked by the sucking head when the sucking head is moved downwardly, and (ii) a second pressure which is higher than the first pressure and high enough to hold the solder balls sucked when the sucking head is moved upwardly.

Still further, according to a third aspect of the present invention, there is provided a method for setting a position and degree of vacuum of a sucking head provided in a solder ball mounting device for mounting solder balls on a workpiece, comprising the steps of: (A) moving the sucking head from a higher position to a lower position at which the solder balls are to be sucked in solder ball sucking holes formed in a lower surface of the sucking head; (B) reducing a pressure in the sucking head to a first pressure so as to suck the solder balls in the solder ball sucking holes after the step (A); (C) moving the sucking head from the lower position to the higher position; and (D) increasing the pressure in the sucking head from the first pressure to a second pressure at which the solder balls are hold in the solder ball sucking holes at the same time of step (C).

DETAILED DESCRIPTION OF THE PREFERRED EMBODIMENTS

Figure 1:
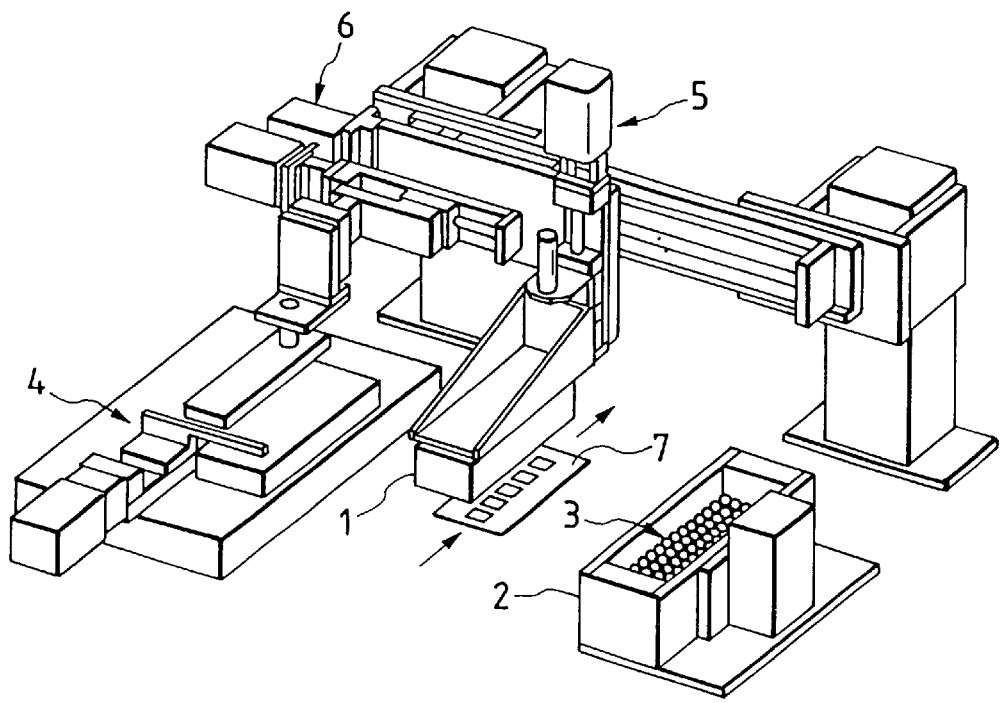
FIG. 1 is a perspective view outlining the arrangement of a solder ball mounting device, an embodiment of the invention.

A solder ball mounting device, an embodiment of the invention, will be described with reference to the accompanying drawings. FIG. 1 is a perspective view outlining the arrangement of the solder ball mounting device according to the invention. In FIG. 1, reference numeral 1 designates a sucking head. The sucking head 1 has a sucking plate on the lower surface which has a plurality of solder ball sucking holes. The sucking head 1 is vertically and horizontally moved with a lift mechanism 5 and a horizontal moving mechanism 6. Further in FIG. 1, reference numeral 2 denotes a solder ball supply box in which a number of solder balls are stored; and 4, a flux supply device.

The sucking head, is moved downwardly, towards the solder ball supply box 2, and performs a ball sucking operation, so that solder balls 3 are sucked in the sucking holes. On the other hand, the flux supply device 4 supplies flux to a flux transfer pin, and then flux is transferred onto a workpiece, namely, a substrate 7 with the aid of the flux transfer pin. Thereafter, as shown in FIG. 1, the sucking head 1 is moved onto the substrate 7, and it is further moved downwardly so that solder balls 3 are mounted on the substrate 7. A feature of the invention resides in the control of the above-described solder ball sucking operation.

Figure 2:
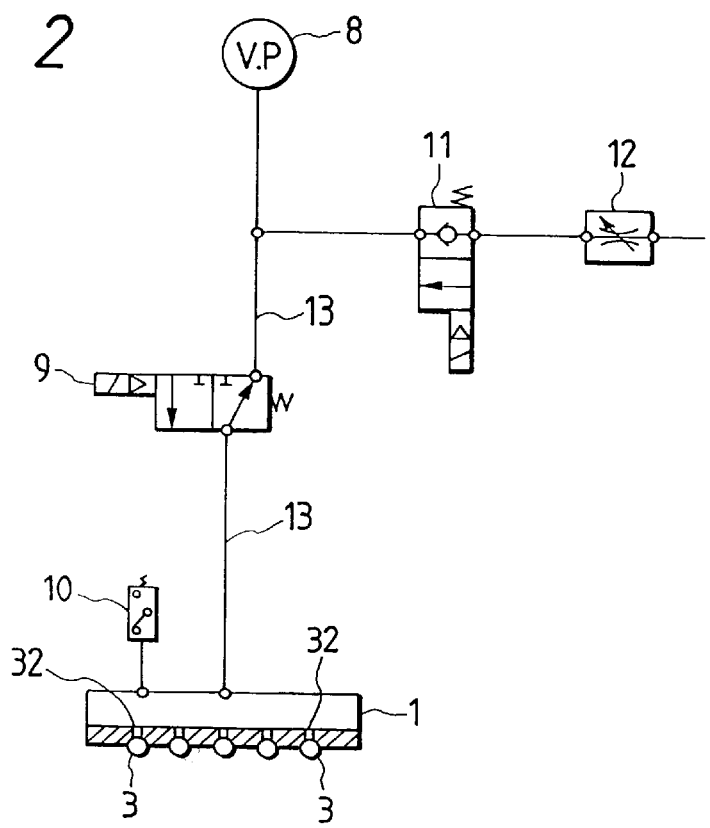
FIG. 2 is a circuit diagram for a description of suction of a sucking head.

The sucking head 1 is coupled to a suction device for sucking solder balls 3. This will be described with reference to a suction circuit shown in FIG. 2. In FIG. 2, reference numeral 8 designates a vacuum pump; and 9, a sucking valve made up of an electromagnetic valve. The vacuum pump 8, the sucking valve 9, and the sucking head 1 are coupled to one another through a suction pipe 13. In the embodiment, the vacuum pump 8 is employed as suction means; however, it may be replaced with a blower.

In the suction device, upon reception of an suction ON signal, the sucking valve 9 is opened, so that the vacuum pump 8 performs a sucking operation with a high degree of vacuum. In the embodiment, a first pressure for sucking solder balls 3 is set by adjusting the operational value of the vacuum pump 8; however, the setting of the first pressure may be obtained by a relief valve which is provided in the suction pipe 13.

In FIG. 2, reference numeral 10 denotes a pressure detector adapted to detect the degree of vacuum in the sucking head 1. Reference numeral 11 designates a vacuum open valve. By opening the vacuum open valve 11, the suction pressure is adjusted to the degree of vacuum which has been set with a throttle valve 12. The vacuum open valve 11 is a second pressure adjusting means in the invention. It sets the pressure in the sucking head 1 to a value (pressure) which is higher than the first pressure adapted to suck solder balls 3 but holds the solder balls 3 thus sucked.

Figure 3:
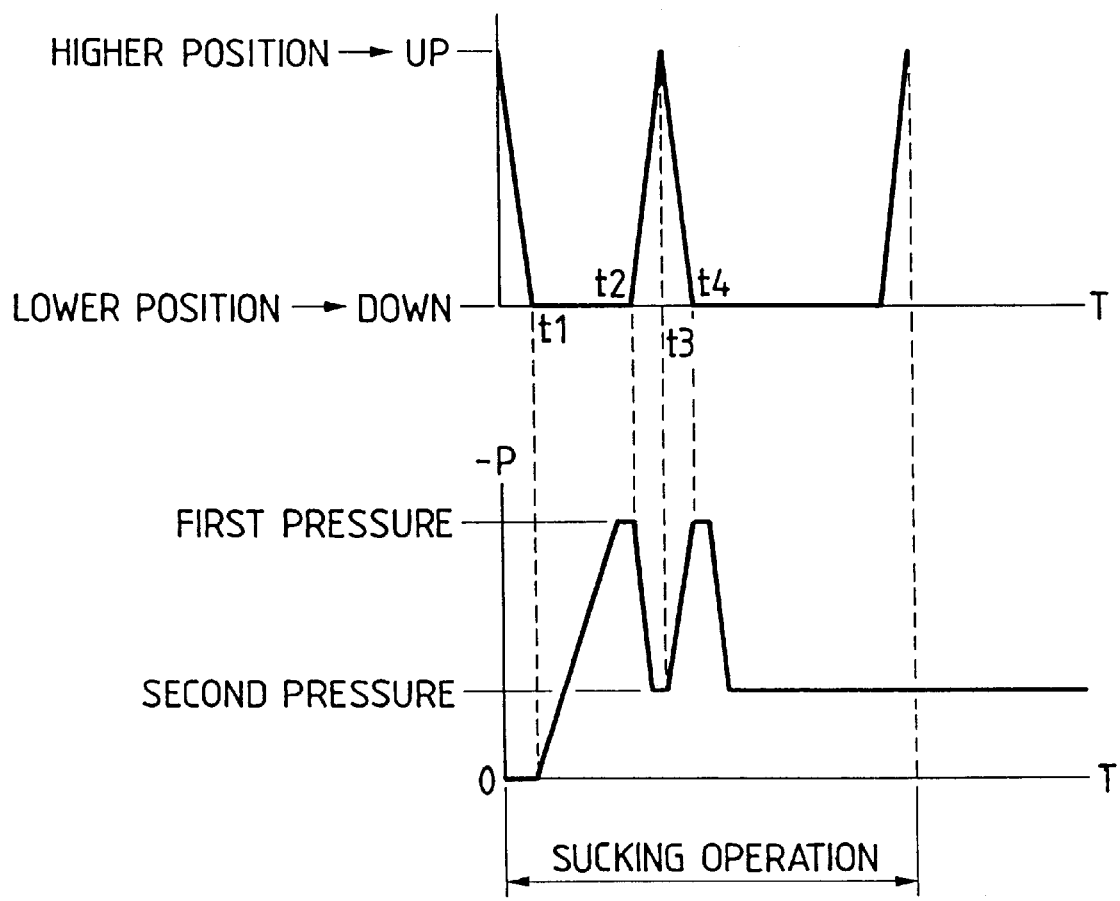
FIG. 3 is a comparison graphical diagram of the vertical movement of the sucking head and the degree of vacuum.
Figure 4:
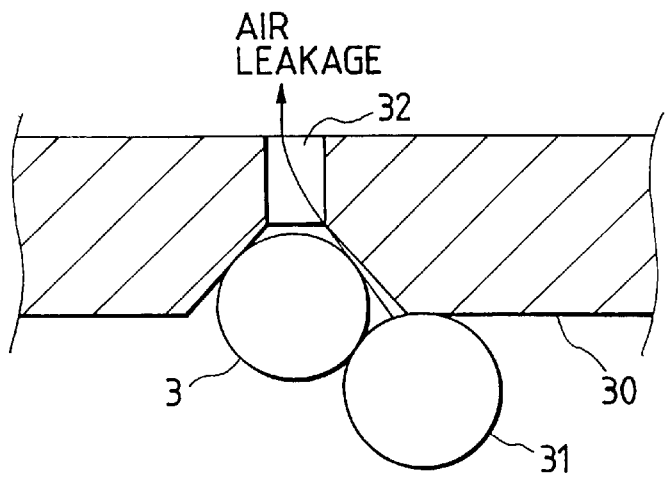
FIG. 4 is an explanatory diagram showing an example of a double ball phenomenon.

Relationships between the vertical movement of the sucking head 1 and the degrees of vacuum will be described with reference to FIG. 3, a comparison graphical representation. The upper part of FIG. 3 shows the vertical movement of the sucking head 1, and the lower part of FIG. 3 indicates the degrees of vacuum. The horizontal axis represents the lapse of time.

The lift mechanism 5 operates to lower the sucking head 1 from the standby position to a solder ball sucking position (the lower position). At the same time, the suction device receives the suction ON signal, to open the sucking valve 9, so that the vacuum pump 8 performs a sucking operation with a high degree of vacuum (t1 in FIG. 3). The sucking operation is continued, solder balls 3 are sucked in almost all the sucking holes 32. The pressure detector 10 detects that the degree of vacuum in the sucking head 1 reaches the first pressure. When a predetermined period of time passes from the detection, it is determined that the solder ball sucking operation has been accomplished (t2 in FIG. 3).

The reason why the accomplishment of the sucking operation is determined after the predetermined period of time is to prevent erroneous operations due to a noise. That is, if the fact that the first pressure is reached is regarded as the completion of the solder ball sucking operation, then the device suffers from the following difficulty: Although solder balls 3 are, in fact, not sufficiently sucked yet, the occurrence of a momentary noise is mistaken for the fact the first pressure has been reached (the solder ball sucking operation has been accomplished).

In the embodiment, the pressure detector 10 serves as an suction confirming sensor. The pressure detector 10 is generally a pressure gauge; however, the following method may be employed: A flow meter is connected to the suction pipe 13 immediately before the sucking head 1, so that the pressure detection operation may be performed with the flow meter.

After the suction of solder balls has been confirmed, the lift mechanism 5 is activated, so that the sucking head is moved upwardly to the upper position (t3 in FIG. 3). This upper position is lower than the upper position of the sucking head 1 which is in a standby state, and the upper position thereof for horizontal movement. On the other hand, after the start of the ascent of the sucking head 1, the vacuum open valve 11 is turned on, and a low degree of vacuum is obtained which is set by the throttle valve 12. In this embodiment, the degree of the vacuum of the vacuum pump 8 is set to −450 mmHg at the operation under the first pressure and to −20 mmHg at the operation under the second pressure. In the case of using a blower in place of the vacuum pump, the degree of the vacuum of the blower is set to −150 mmHg at the operation under the first pressure and to −20 mmHg at the operation under the second pressure. Time period of t2 to t3 is set to about 0.2 seconds, and time period of t3 to t4 is set to about 0.2 seconds. Time period of one series of the sucking operation ("sucking operation" in FIG. 3) is about 1.5 seconds. Of course, the degree of the vacuum and the time period are not limited to the above values.

Further, in order to prevent the incomplete sucking of solder balls positively, the following operations are also performed according to the present invention. That is, after the sucking head 1 is moved upwardly by the lift mechanism 5 as aforementioned, the sucking head 1 is moved downwardly to the lower position, and the pressure in the sucking head 1 is set to the first pressure (t4 in FIG. 3). Under this condition, the time control is effected, so that, the pressure in the sucking head 1 is set to the second pressure in a predetermined period of time.

The fact that the pressure in the sucking head is set to the second pressure in the predetermined period of time is due to the following reason: If the second pressure setting operation is performed at the start of the ascent of the sucking head, since the second pressure setting operation is achieved by opening the vacuum open valve 11, the degree of vacuum is not immediately decreased; that is, the degree of vacuum of the sucking head 1 becomes only slightly lower than the first pressure. When, under this condition, the pressure is set to the first pressure again, immediately the first pressure is reached. This means that the suction at the lower position which is the position best in height for the suction of solder balls is immediately ended, and the following operating condition is obtained; that is, the pressure is shifted to the second pressure. In this case, even if there is a sucking hole which is not closed with a solder ball 3, it may not suck a solder ball. In order to overcome this difficulty, the pressure in the sucking head is set to the second pressure in the predetermined period of time.

In the embodiment of FIG. 3, the sucking head is moved upwardly again, and the solder ball mounting operation is effected.

In the present invention, after solder balls have been sucked, the degree of vacuum in the sucking head is changed to a low value (the second pressure) which is low enough to hold the solder balls. Therefore, the air leakage from the solder ball sucking section is reduced, and the occurrence of "double ball phenomenon" is decreased in frequency. Even if the double ball phenomenon occurs, since the degree of vacuum in the sucking head is set to the second pressure which is lower than the first pressure employed to suck solder balls, the force of sucking solder balls which form double balls is eliminated, so that those balls falls down by their own weights. That is, the double ball phenomenon is eliminated.

The solder balls are sucked with a high degree of vacuum (the first pressure) only when sucked, and when the solder balls are held or moved, they are held with the second pressure which is lower in the degree of vacuum than the first pressure, and therefore the force of holding solder balls in the sucking holes is decreased. This feature prevents the solder balls from erroneously mounting on the substrate.

When the sucking head is at the lower position, the air for floating the solder balls is applied to the lower surface of the sucking head, and a draft is formed thereat. The draft thus formed may shift the solder balls to the end of the solder ball supplying box. In the present invention, except when the solder ball sucking operation is carried out the double ball trouble eliminating operation is performed with the sucking head at the upper position. Hence, the deflection of solder balls is eliminated.

Further, after the sucking head is moved upwardly, it is moved downwardly again, to suck solder balls thereby to prevent the incomplete sucking of solder balls. This effect may be obtained by moving the sucking head up and down several times.

What is claimed is:

1. A solder ball mounting device for mounting solder balls on a workpiece, comprising:

a solder ball supply in which the solder balls are stored;

a sucking head having a plurality of solder ball sucking holes in a lower surface thereof;

sucking means for creating a vacuum in said sucking head, said sucking means coupled to said sucking head so as to suck the solder balls in said ball sucking holes;

lift means for vertically moving said sucking head; and pressure adjusting means for adjusting and setting a degree of vacuum in said sucking head to a first pressure for sucking the solder balls, and to a second pressure which is lower in the degree of vacuum than the first pressure and is high enough to hold the solder balls sucked;

wherein, when said sucking head is lowered by said lift means to a lower position where said sucking head sucks the solder balls in said ball sucking holes, said pressure adjusting means is operable to adjust and set the degree of vacuum in said sucking head to the first pressure, and when the degree of vacuum in said sucking head reaches the first pressure, said lift means is operable to move said sucking head upwardly, and thereafter said pressure adjusting means is operable to adjust the degree of vacuum in said sucking head thereby setting to said second pressure.

2. The solder ball mounting device according to claim 1, wherein, after said lift means moves said sucking head upwardly and said pressure adjusting means starts adjusting the degree of vacuum in said sucking head thereby setting to said second pressure, said lift means is operable to move said sucking head downwardly to the lower position while said pressure adjusting means adjusts and sets the degree of vacuum in said sucking head to the first pressure, and in a predetermined period of time thereafter the degree of vacuum in said sucking head is set again to the second pressure.

3. The solder ball mounting device according to claim 1, wherein said sucking means comprises:

one of a vacuum pump and a blower;

a sucking valve comprising an electromagnetic valve; and a suction pipe for coupling said sucking head, said vacuum pump and said sucking valve.

4. The solder ball mounting device according to claim 3, wherein said pressure adjusting means comprises:

a pressure detector coupled to said sucking head so as to detect the degree of vacuum in said sucking head;

a vacuum open valve coupled to said suction pipe; and a throttle valve coupled to said vacuum open valve.

5. A solder ball mounting device for mounting solder balls on a workpiece, comprising:

a solder ball supply in which the solder balls are stored;

a sucking head having a plurality of solder ball sucking holes in a lower surface thereof;

sucking means for creating a vacuum in said sucking head, said sucking means coupled to said sucking head so as to suck the solder balls in said ball sucking holes;

wherein, when the solder balls are to be sucked in said sucking holes, said sucking head is moved up and down plural times to suck solder balls, and the solder balls thus sucked are mounted on the workpiece; and pressure setting means for adjusting and setting degree of vacuum in said sucking head to (i) a first pressure with which the solder balls are sucked by said sucking head when said sucking head is moved downwardly, and (ii) a second pressure which is higher than the first pressure and high enough to hold the solder balls sucked when said sucking head is moved upwardly.

6. The solder ball mounting device according to claim 5, wherein said sucking means comprises:

one of a vacuum pump and a blower;

a sucking valve comprising an electromagnetic valve; and a suction pipe for coupling said sucking head, said vacuum pump and said sucking valve.

7. The solder ball mounting device according to claim 6, wherein said pressure adjusting means comprises:

a pressure detector coupled to said sucking head so as to detect the degree of vacuum in said sucking head;

a vacuum open valve coupled to said suction pipe; and a throttle valve coupled to said vacuum open valve.

8. A solder ball mounting device for mounting solder balls on a workpiece, comprising:

a solder ball supply in which the solder balls are stored;

a sucking head having a plurality of solder ball sucking holes in a lower surface thereof;

a sucking device which creates a vacuum in said sucking head, said sucking device coupled to said sucking head so as to suck the solder balls in said ball sucking holes;

a lift device which vertically moves said sucking head; and pressure adjusting means for adjusting and setting a degree of vacuum in said sucking head to a first pressure for sucking the solder balls, and to a second pressure which is lower in the degree of vacuum than the first pressure and is high enough to hold the solder balls sucked;

wherein, when said sucking head is lowered by said lift device to a lower position where said sucking head sucks the solder balls in said ball sucking holes, said pressure adjusting means is operable to adjust and set the degree of vacuum in said sucking head to the first pressure, and when the degree of vacuum in said sucking head reaches a predetermined pressure, said pressure adjusting means is operable to adjust the degree of vacuum in said sucking head thereby setting to said second pressure.

9. The solder ball mounting device according to claim 8, wherein said sucking device comprises:

one of a vacuum pump and a blower;

a sucking valve comprising an electromagnetic valve; and a suction pipe for coupling said sucking head, said vacuum pump and said sucking valve.

10. The solder ball mounting device according to claim 9, wherein said pressure adjusting means comprises:

a pressure detector coupled to said sucking head so as to detect the degree of vacuum in said sucking head;

a vacuum open valve coupled to said sucking head; and a throttle valve coupled to said vacuum open valve.

\* \* \* \* \*